United States Patent
Cohen et al.

(10) Patent No.: US 7,446,025 B2
(45) Date of Patent: Nov. 4, 2008

(54) METHOD OF FORMING VERTICAL FET WITH NANOWIRE CHANNELS AND A SILICIDED BOTTOM CONTACT

(75) Inventors: Guy M. Cohen, Mohegan Lake, NY (US); Paul M. Solomon, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 1 day.

(21) Appl. No.: 11/742,180

(22) Filed: Apr. 30, 2007

(65) Prior Publication Data
US 2007/0202674 A1 Aug. 30, 2007

Related U.S. Application Data

(62) Division of application No. 11/135,227, filed on May 23, 2005, now Pat. No. 7,230,286.

(51) Int. Cl.
*H01L 21/324* (2006.01)
(52) U.S. Cl. ........................ 438/583; 977/762
(58) Field of Classification Search ............. 977/762, 977/755, 938; 438/583
See application file for complete search history.

(56) References Cited

U.S. PATENT DOCUMENTS

| | | | |
|---|---|---|---|
| 6,897,098 B2 | 5/2005 | Hareland et al. | |
| 7,217,650 B1 * | 5/2007 | Ng et al. | 438/622 |
| 7,307,271 B2 * | 12/2007 | Islam et al. | 257/14 |
| 2003/0211724 A1 | 11/2003 | Haase | |
| 2005/0064185 A1 * | 3/2005 | Buretea et al. | 428/364 |
| 2005/0095780 A1 * | 5/2005 | Gutsche et al. | 438/243 |
| 2005/0167655 A1 | 8/2005 | Furukawa et al. | |
| 2006/0125025 A1 * | 6/2006 | Kawashima et al. | 257/401 |
| 2006/0138575 A1 * | 6/2006 | Kamins | 257/419 |
| 2006/0186451 A1 * | 8/2006 | Dusberg et al. | 257/306 |
| 2006/0278901 A1 * | 12/2006 | Dangelo et al. | 257/276 |

OTHER PUBLICATIONS

Cui, et al., "High Performance Silicon Nanowire Field Effect Transistors", Nano Letters, 2003, pp. 149-152, vol. 3, No. 2, 2003 American Chemical Society, Published on Web Jan. 1, 2003.

Greytak, et al., "Growth and Transport Properties of Complementary Germanium Nanowire Field-Effect Transistors", Applied Physics Letters, May 24, 2004, pp. 4176-4178, vol. 84, No. 21.

Ng, et al., "Single Crystal Nanowire Vertical Surround-Gate Field-Effect Transistor", Nano Letters, 2004, pp. 1247-1252, vol. 4, No. 7, 2004 American Chemical Society, Published on Web May 29, 2004.

(Continued)

*Primary Examiner*—Thao P. Le
(74) *Attorney, Agent, or Firm*—Scully, Scott, Murphy & Presser, P.C.; Robert M. Trepp, Esq.

(57) ABSTRACT

A vertical FET structure with nanowire forming the FET channels is disclosed. The nanowires are formed over a conductive silicide layer. The nanowires are gated by a surrounding gate. Top and bottom insulator plugs function as gate spacers and reduce the gate-source and gate-drain capacitance.

1 Claim, 14 Drawing Sheets

OTHER PUBLICATIONS

Duan, et al., "High-Performance Thin-Film Transistors Using Semiconductor Nanowires and Nanoribbons", Nature, Sep. 18, 2003, pp. 274-278, vol. 425.

Yang, et al., "25-nm p-Channel Vertical MOSFET's with SiGeC Source Drains", IEEE Electron Device Letters, Jun. 1999, pp. 301-303, vol. 20, No. 6.

Hergenrother, et al., "The Vertical Replacement-Gate (VRG) MOSFET: A 50-nm Vertical MOSFET with Lithography-Independent Gate Length", IEEE, 1999.

Tung, et al., "Growth of Single Crystal Epitaxial Silicides on Silicon by the Use of Template Layers", 1983 American Institute of Physics, Applied Physics Letters, May 15, 1983, pp. 888-890, vol. 42, No. 10, downloaded Mar. 28, 2005 to 129.34.20.23.

Tung, et al., "Formation of Ultrathin Single-Crystal Silicide Films on Si: Surface and Interfacial Stabilization of Si-NiSi2 Epitaxial Structures", Physical Review Letters, Feb. 7, 1983, pp. 429-432, vol. 50, No. 6.

* cited by examiner

METHOD OF FORMING VERTICAL FET WITH NANOWIRE CHANNELS AND A SILICIDED BOTTOM CONTACT

RELATED APPLICATIONS

This application is a divisional application of U.S. Ser. No. 11/135,227, now U.S. Pat. No. 7,230,286 filed May 23, 2005.

FIELD OF THE INVENTION

The present invention relates to electronic devices based on semiconductor nanowires, and more specifically to a vertical field effect transistor (FET) with nanowire channels and a silicided bottom contact. The present invention also relates to methods of fabricating the vertical FET containing nanowire channels and a silicided bottom contact.

BACKGROUND OF THE INVENTION

Conventional vertical FETs are devices in which the source-drain current is flowing in a direction perpendicular to the substrate surface. For example, if the substrate surface is made horizontal, then the vertical FET is typically a vertical pillar with the drain and source being the top and bottom portion of the pillar. One of the main advantages of the vertical FET is that the channel length is not defined by lithography, but rather by methods such as epitaxy or layer deposition which provide good thickness control even at nanometer dimensions. Some examples of vertical FET are found in Min Yang, et al., "25-nm p-channel vertical MOSFET's with SiGeC source-drains", IEEE Electron Dev. Lett., 20, p. 301, (1999), and J. M. Hergenrother, et al., "The vertical replacement-gate (VGR) MOSFET: A 50 nm vertical MOSFET with lithography-independent gate length", Int. Electron Dev. Meeting (IEDM), p. 75, 1999.

Conventional vertical FETs have several issues. First, it is difficult to efficiently contact the source (or drain) at the bottom of the pillar. This difficulty results in a relatively high access series resistance to the source (or drain). Second, doping cannot be achieved by implantation, but rather by in-situ doping during epitaxy, or diffusion from solid sources. Third, the gate-source capacitance is high since the gate conductor overlaps the source conductor. Fourth, the channel surface is defined by etching of the pillar or by epitaxial growth from a trench; etching typically leaves rough walls with reactive-ion etch (RIE) damage, while constrained epitaxy also exhibits defects. Fifth, fabrication of n-FETs and p-FETs devices on the same wafer for CMOS circuits requires the introduction of different dopants in the gate and the source and drain regions. This is very difficult to do because of the incompatibility with ion-implantation that is routinely used with planar FETs. Given the above challenges, prior art vertical FETs were rarely used for CMOS technology.

Recent work has shown that silicon nanowires can be used to fabricate FETs. See, for example, Yi Cui, et al., "High Performance Silicon Nanowire Field Effect Transistors", Nano Lett., 3(2), p. 149, (2003), Andrew B. Greytak, et al., "Growth and transport properties of complementary germanium nanowire field-effect transistors", Appl. Phys. Lett., 84(21), p. 4176, (2004), and Xiangfeng Duan, et. al, "High-performance thin-film transistors using semiconductor nanowires and nanoribbons", Nature, 245, p. 274, (2003). As of now, reported nanowire FETs mainly used a horizontal configuration where a single nanowire was contacted by conventional lithography and back gated by applying voltage to the substrate (see, Yi Cui, et al. and Andrew B. Greytak et al. mentioned above). In these reports, the position of the nanowires contacted to make a FET was random and their current drive was limited to a single nanowire.

Recently a horizontal (planar) thin film transistor (TFT) using a plurality of parallel nanowires that were assembled using a fluidic flow alignment approach (uniaxially compressed on a Langmuir-Blodgett) was reported. See, for example, Xiangfeng Duan, et al., "High-performance thin-film transistors using semiconductor nanowires and nanoribbons", Nature, 245, p. 274, (2003). Yet, the issue of how to accurately position and orient nanowires for making planar nanowire FETs on a large scale is currently an open problem.

To circumvent the manipulation of nanowires, it possible to build a vertical nanowire FET, where the position of the nanowires is already determined at the time of the nanowire growth. In this case, the FET's channel consists of a plurality of nanowires to meet a specified current drive. A first report on vertical surround-gate FET using a single ZnO nanowire channel is given in Hou T. Ng, et al., "Single Crystal Nanowire Vertical Surround-Gate Field-Effect Transistor", Nano Lett., 4(7), p. 1247, (2004).

The Hou T. Ng, et al. paper does not address the main deficiencies associated with vertical MOSFETs, which are how to reduce the access resistance to the bottom contact, and how to accurately control the gate length. Additionally, the Hou T. Ng, et al. paper does not address how to use a plurality of nanowires in the fabrication of the MOSFET.

In view of the foregoing, there is a need for providing a vertical FET which includes a plurality of nanowire channels in which the access resistance to the bottom contact is reduced and where the gate length is controlled.

SUMMARY OF THE INVENTION

The present invention provides a vertical FET with nanowire channels. Each vertical FET of the present invention includes a plurality of nanowire channels. The nanowires used as the channels of the inventive vertical FET are formed over a crystalline conductive layer, such as a silicide layer, to reduce the access series resistance to the source. The nanowires are surrounded by a gate material and are made with a small diameter (on the order about 10 nm or less) to obtain good short channel characteristics (e.g., the present invention substantially reduces the short channel effect which is the decrease of the MOSFET threshold voltage as the channel length is reduced). The nanowires of the inventive vertical FET are formed in a dense array so the gate-source overlap capacitance is reduced.

In a first aspect of the present invention, a semiconductor structure such as a FET comprising nanowire channels, a surrounding gate for controlling the current through the nanowire channels, top and bottom source and drain regions located in each nanowire, and a conductive bottom contact layer is described.

Specifically, the semiconductor structure of the present invention includes a silicide contact layer located within, or on, a portion of a semiconductor substrate; a plurality of nanowires located on said silicide contact layer; a gate dielectric surrounding said plurality of nanowires; a gate conductor located on said gate dielectric; and a source and drain located at each end of said nanowires.

More specifically, the FET of the present invention comprises a bottom epitaxial conductive layer; a plurality of semiconductor nanowire channels located on said bottom epitaxial conductive layer, wherein said plurality of semiconductor nanowire channels are perpendicular to said bottom epitaxial conductive layer; a top contact layer located over said nanowire channels, wherein the contact layer is perpendicular to said plurality of semiconductor nanowire channels; a gate dielectric surrounding each of said semiconductor nanowire channels; a gate conductor surrounding said gate dielectric, wherein said gate conductor is spaced from the bottom epitaxial conductive layer by a bottom insulating layer and said gate conductor is spaced from the top contact layer by an insulator plug; and a source and drain located at each end of said plurality of semiconductor nanowire channels.

In some embodiments of the present invention, the spacing between nanowires channels is comparable to the nanowire channel diameter. Typically, the spacing between each nanowire is from about 2 nm to about 50 nm, which is substantially equal to the diameter of an individual nanowire channel.

In a second aspect of the present invention, methods for fabricating a semiconductor structure such as a FET with nanowire channels are described. In one of these methods, the surface of a semiconductor substrate is exposed in selected regions designated for FETs and a silicide contact layer is formed in the exposed regions. The silicide contact can be formed within the semiconductor substrate at a surface portion thereof, or atop the semiconductor substrate. The silicide contact layer formed preserves the crystalline template of the underlying silicon; hence the silicide contact layer mimics the semiconductor substrate crystal orientation. A catalyst is placed over the silicide layer and nanowires are grown perpendicular to the substrate surface. The nanowires formed may include a material that is the same or different from the semiconductor substrate. The catalyst is typically removed from the tip of each of the nanowires, and a conformal gate dielectric is deposited. A gate conductor material is deposited that fills the space between the nanowires. The structure is then planarized by chemical mechanical polishing (CMP). The planarization trims the nanowires to a specified length and removes the excess gate material. The gate material is recessed with respect to the top surface of the nanowires. Insulator plugs are formed in the recessed region and a top contact is formed. Gate and source contacts vias are made to complete the device fabrication.

The method of the present invention is described using silicon nanowires and silicon processing. The method can also be practiced with other semiconductors such as Ge or III-V semiconductors. One of the advantages of using nanowires is that due to their typical small diameter (a few nanometers) the nanowires can be grown on a crystalline substrate even if a large lattice mismatch is present. For example, Ge nanowires can be grown on a silicon substrate. Therefore, the vertical FET channel can be made of semiconductor nanowires other than silicon even if the substrate is silicon.

DETAILED DESCRIPTION OF THE INVENTION

The present invention, which provides a vertical FET with nanowire channels as well as methods for fabricating the same, will now be described in greater detail by referring to the following discussion. In this discussion, reference will be made to various drawings that illustrate embodiments of the present invention. Since the drawings of the embodiments of the present invention are provided for illustrative purposes, the structures contained therein are not drawn to scale.

It is again emphasized that the method of the present invention is described using silicon nanowires and silicon processing. The inventive method can also be practiced with other semiconductors such as Ge or III-V semiconductors. When non-Si-containing semiconductors are used, the processing steps of the present invention are basically the same except that a layer of Si can be formed atop the non-semiconductor surface prior to forming the silicide contact layer. Use of Si-containing semiconductor materials such as Si, SiGe, Si/SiGe, silicon-on-insulator (SOI), silicon germanium-on-insulator (SGOI), SiC or SiGeC, for example, are however preferred.

Figure 1:
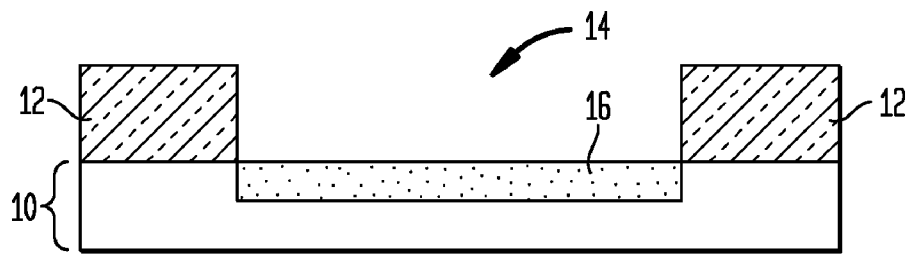
FIGS. 1-10 and 17 are pictorial representations (through cross sectional views) illustrating the basic processing steps for fabricating a vertical FET with nanowire channels.

The basic method is shown in FIGS. 1-10 and 17. A silicon wafer 10 is used as the starting semiconductor substrate. The Si substrate is typically chosen to have the (111) orientation so that the nanowires growth will be perpendicular to the substrate surface. Although a (111) crystal orientation is typically used, the present invention also contemplates using substrates that have other crystallographic orientations. An insulator film 12 such as silicon dioxide ($SiO_2$), silicon nitride ($Si_3N_4$) or silicon oxynitride (SiON) is deposited on the substrate 10. Openings 14, one of which is shown in FIG. 1, are formed in the insulator film 12 by conventional lithography and etching. Openings 14 are defined by mask 1 as shown in FIG. 11. The location of the openings 14 defines the region that will be occupied by the vertical FET. The exposed substrate 10 is heavily doped (on the order of about $10^{20}$ $cm^{-3}$) to form $n^{++}$ region 16 in the substrate 10. A blanket ion-implant, or gas phase doping can be used to introduce the dopant into the exposed region. Examples of n-type dopants are phosphorus (P), and arsenic (As). When a p-FET is fabricated, the n-type region 16 is replaced with a p-type region.

Examples of p-type dopants are boron (B), and indium (In).

Figure 2:
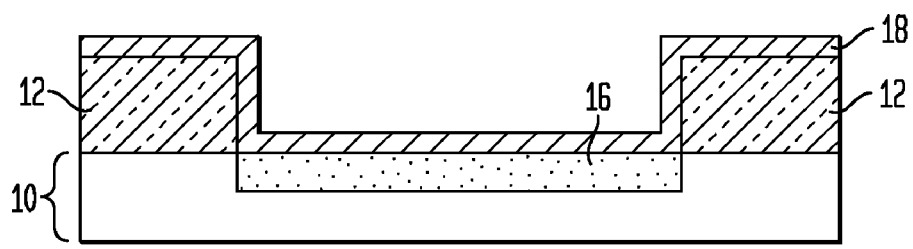

A layer of metal 18, such as nickel (Ni), cobalt (Co), titanium (Ti), tungsten (W) or other like metals that are capable of forming a silicide when reacted with silicon, is blanket deposited as illustrated in FIG. 2. Preferably, Ni or Co are employed since those materials can form epitaxial conductive layers. The metal deposition is typically carried out by sputtering, evaporation, chemical vapor deposition or a similar deposition process. The layer of metal 18 is reacted with the exposed silicon surface 10 to form a silicide contact 20. The silicide formation includes the uses of a conventional self-aligned silicidation (SALICIDE) process. With this process, the silicide forms only over exposed silicon regions. The exact conditions of the anneal used during the self-aligned silicidation process may vary depending on the type of metal used as layer 18. A single anneal step may be used, followed by etching of any unreacted metal. Alternatively, the silicide contact 20 can be formed by a first anneal, etching and a second anneal, wherein the temperature of the first anneal is typically lower than the temperature of the second annealing. In cases where a non Si-containing semiconductor substrate is formed, a Si layer is typically formed within the opening prior to metal layer 18 deposition. Alternatively, a metal-semiconductor alloy can be formed, if it has low resistance (on the order of about 50 μΩ-cm or less). For example, if a germanium (Ge) substrate is used a metal-gemanide alloy such as Ni-germanide can be formed.

Figure 3:
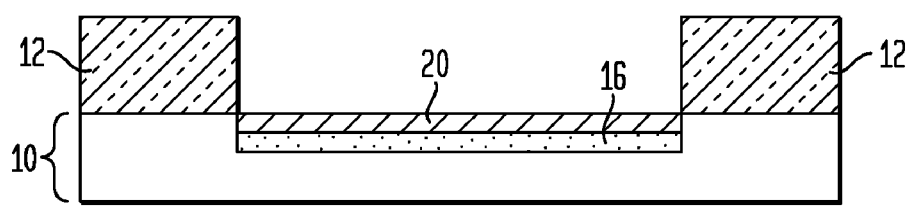

Depending again on the type of metal used as well as the anneal conditions different phases of the silicide contact can be formed. In the case of Ni, for example, the metal-silicide that forms is either NiSi or $NiSi_2$. The NiSi phase forms by annealing the substrate 10 including metal layer 18 at a temperature of about 450° C. The $NiSi_2$ phase forms by annealing the substrate at a temperature above 750° C. Since the metal layer 18 reacts only with the exposed silicon a selective etch is used to remove the unreacted metal 18 from non-silicon surfaces (FIG. 3). An example of the etch chemistry used to remove the unreacted metal is $H_2O_2:H_2SO_4$ 10:1 at 65° C. for 10 min. The NiSi phase has a lower resistivity than $NiSi_2$. However, the $NiSi_2$ phase can be epitaxial to silicon so it does preserve the crystal template of the underlying silicon substrate. See, for example, R. T. Tung, et al., "Formation of Ultrathin Single-Crystal Silicide Films on Si: Surface and Interfacial Stabilization of Si—$NiSi_2$ Epitaxial Structures", Phys. Rev. Lett. 50, p. 429 (1983), and R. T. Tung, et al., "Growth of single crystal epitaxial silicides on silicon by the use of template layers", Appl. Phys. Lett. 42, p. 888 (1983). This property of $NiSi_2$ enables the growth of silicon nanowires over a silicide contact 20 that maintain the same crystal orientation as that of the substrate 10.

Figure 4:
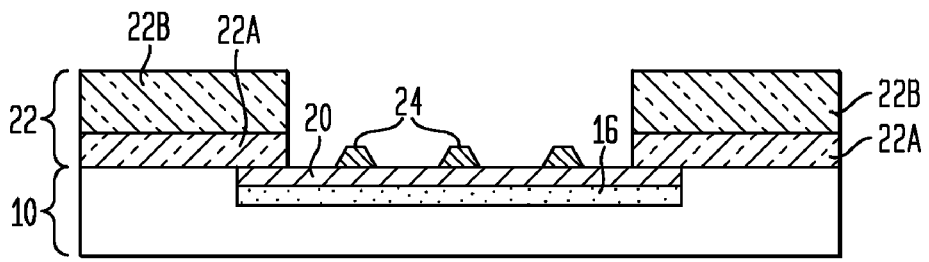
Figure 12:
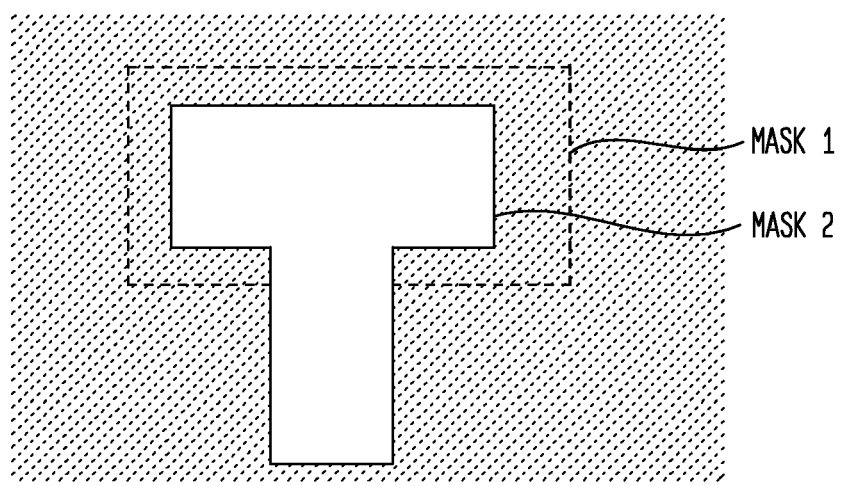
Figure 13:
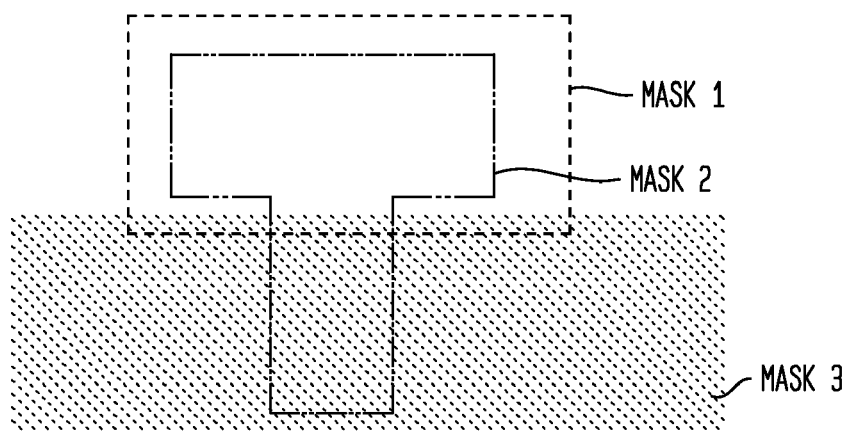

Referring to FIG. 4, the insulator film 12 is stripped and a bi-layer film 22 consisting of layers 22A and 22B is deposited. These layers can be $SiO_2$ and $Si_3N_4$, respectively. The bi-layer film 22 is patterned in two steps: Following the example illustrated by FIGS. 12 and 13, mask 2 is first used to etch a "T" shape in the top film 22B. The etch stops on the insulator film 22A. Then mask 3 is used to define the region where layer 22A is etched. The exposed silicide contact 20 surface is contained within the region defined by the opening 14 (mask 1).

Catalyst dots 24 such as Au, Ga, Al, Ti, and Ni for the nanowire growth are formed over the exposed silicide contact 20. Of the catalyst dots 24 mentioned herein, Au dots are preferred. The catalyst dots 24 can be formed by patterning a catalyst film into dots or by dispensing a colloid containing said catalyst. It is noted that the size, e.g., width, of the catalyst dots 24 defines the nanowire diameter. Thus, accurate control of the dot size is important for obtaining a tight distribution of the nanowire's diameter. Other methods for introducing the catalyst are also possible. For example, a thin catalyst film will agglomerate into separated catalyst droplets if annealed at elevated temperatures (e.g., above 350° C.). The catalyst agglomeration method, however, does not yield a narrow distribution of the dot size as typically obtained by the catalyst suspension method. Moreover, the catalyst dots can be formed utilizing a self-assembly process. The term "self-assembly" is used herein to denote the spontaneous organization of a material into a regular pattern. The self-assembly process utilizes block copolymers and techniques well known in the art.

Figure 5:
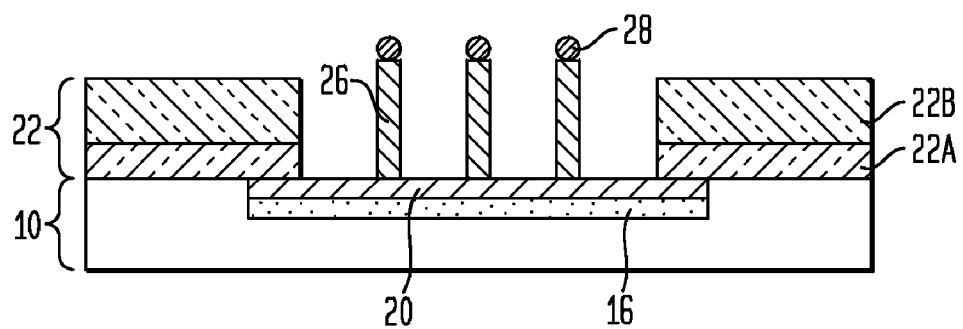

Referring to FIGS. 4 and 5, nanowires 26 are grown perpendicular to the substrate 10 surface. The growth of the nanowires 26 is assisted by the catalyst dots 24 and is typically carried out by chemical vapor deposition (CVD) or plasma enhanced chemical vapor deposition (PECVD). The growth temperature depends on the precursor used. For example, for silane ($SiH_4$) a typical growth temperature is from about 370° C. to about 500° C. For silicon tetrachloride ($SiCl_4$), the growth temperature is from about 800° C. to about 950° C. By adding chlorine to $SiH_4$, the growth temperature can be raised to above 600° C. The growth rate of the nanowires 26 depends on the growth temperature and the gas pressure in the growth chamber. For example, a typical CVD growth rate for $SiH_4$ diluted with $H_2$ (1:1) at a pressure of 1 torr and a growth temperature of 450° C. is about 7.6 μm/hour. The anisotropic growth of the nanowires 26 is believed to be best described by the vapor-liquid-solid (VLS) mechanism, which is described, for example, in E. I. Givargizov, Highly Anisotropic Crystals, Kluwer academic publishers, Norwell Mass., 1986. When the growth is initiated, a catalyst-silicon liquid alloy 28 is formed. With additional supply of Si from the gas phase (e.g., $SiH_4$), the liquid droplet becomes supersaturated with Si and the excess silicon is deposited at the solid-liquid interface. As a result the liquid droplet 28 rises from the original substrate surface to the tip of a growing nanowire crystal. If the growth temperature is kept below about 500° C. (if $SiH_4$ is used), or alternatively a chlorine additive is used, no deposition of silicon take place on the other surfaces. Note that the nanowires 26 can be comprised of the same or different material as that of the semiconductor substrate. In one embodiment, it is preferred that the nanowires 26 by comprised of a material that is different from the semiconductor substrate. In yet another embodiment of the present invention, the nanowires are single-crystal Si nanowires having substantially the same crystal orientation.

In the specific example described herein in which Si nanowires are formed on a (111) oriented Si substrate, the silicon nanowires orientation is (111) as it is seeded from the substrate 10 which also has the (111) orientation. This is why a silicide film 20, which mimics the substrate's orientation is used. The nanowires 26 are grown to a length that typically exceeds the total thickness of the films 22A and 22B. It is noted that the nanowires 26 are grown perpendicular to the surface of substrate 10.

Figure 6:
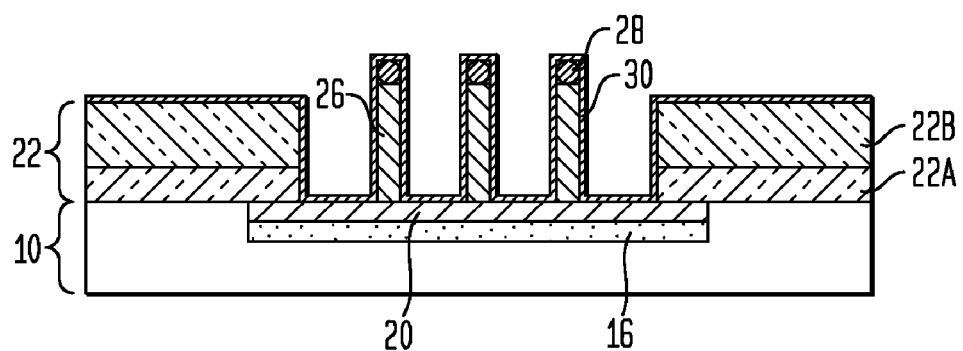

Referring to FIG. 6, a conformal gate dielectric 30 is blanket deposited over the substrate. Some examples of gate dielectrics include, but are not limited to: $SiO_2$, $Al_2O_3$, and $HfO_2$. The deposition of the gate dielectric 30 is performed by techniques such as, for example, CVD or atomic layer deposition (ALD). It is noted that since there is no more need for the catalyst 24 once the nanowires 26 growth is completed, it can be removed by selective etching prior to the gate dielectric 30 deposition. On the other hand, keeping the catalyst 24 can provide additional etch selectivity and thus protect the nanowires 26 during the gate conductor recess etch as will be discussed later.

Figure 7:
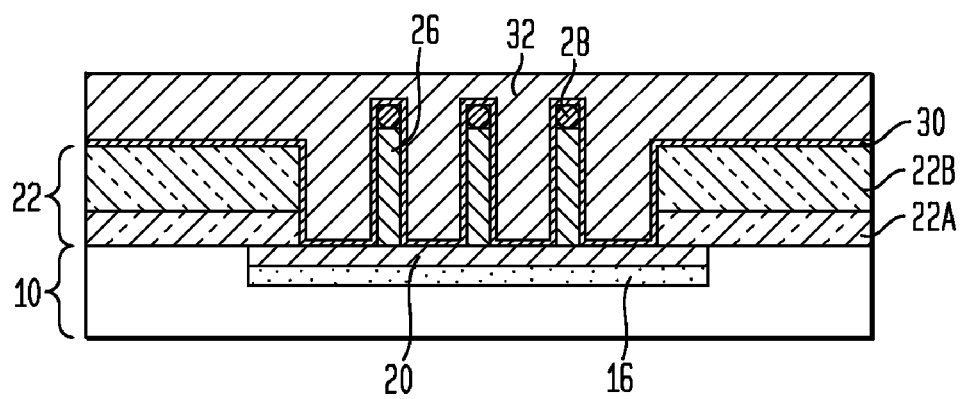
Figure 8:
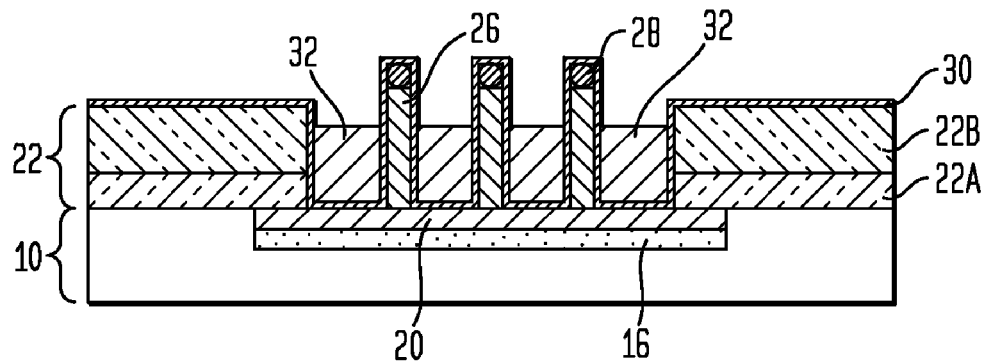
Figure 9:
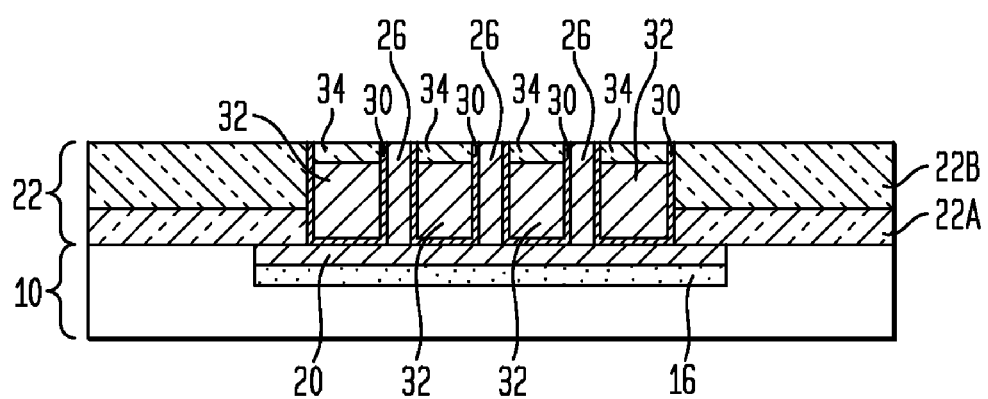

Referring to FIG. 7, a conformal gate conductor 32 is deposited over the gate dielectric 30. The gate conductor 32 fills the space between the nanowires 26. The gate conductor 32 can be doped poly-silicon, or a conductive metal such as tungsten (W), aluminum (Al), copper (Cu), or tantalum (Ta). Alloys of the conductive metals as well as silicides or nitrides of said conductive metals are also contemplated herein. The gate conductor 32 is then recessed by selective etching with respect to the gate dielectric 30 to provide the structure shown, for example, in FIG. 8. As shown, this step of the present invention brings the top portion of the recessed gate conductor 32 below the surface line of the insulator layer 22. Another insulator 34 such as a low temperature oxide (LTO) is blanket deposited over the structure. The structure is then planarized by CMP to provide the structure illustrated by FIG. 9. The insulator layer 22B is used as a CMP stop layer. The CMP step trims the nanowires 26 to be all of the same length. It also forms insulator plugs 34 that buffer the recessed gate conductor 32 from the top surface. This allows contacting the exposed ends of the nanowires 26 without shorting to the gate 32. Using a SALICIDE process, the tip of each nanowire 26 is silicided forming ends 38 that are silicided.

Figure 10:
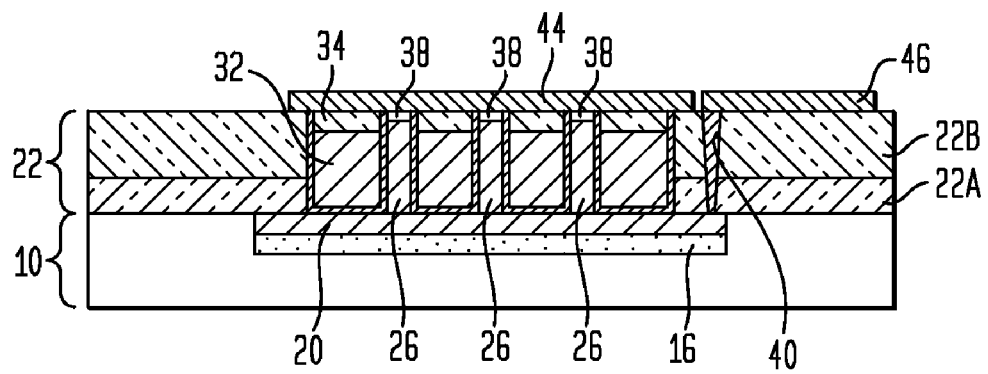
Figure 11:
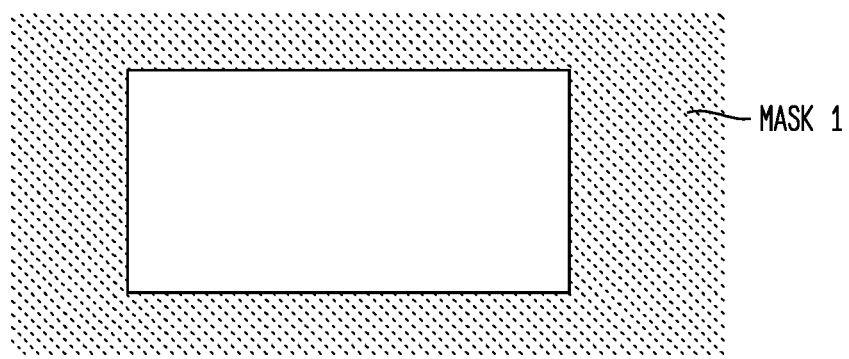
FIGS. 11-16 are pictorial representations (top views) illustrating the basic mask set used for fabricating a vertical FET with nanowire channels.
Figure 14:
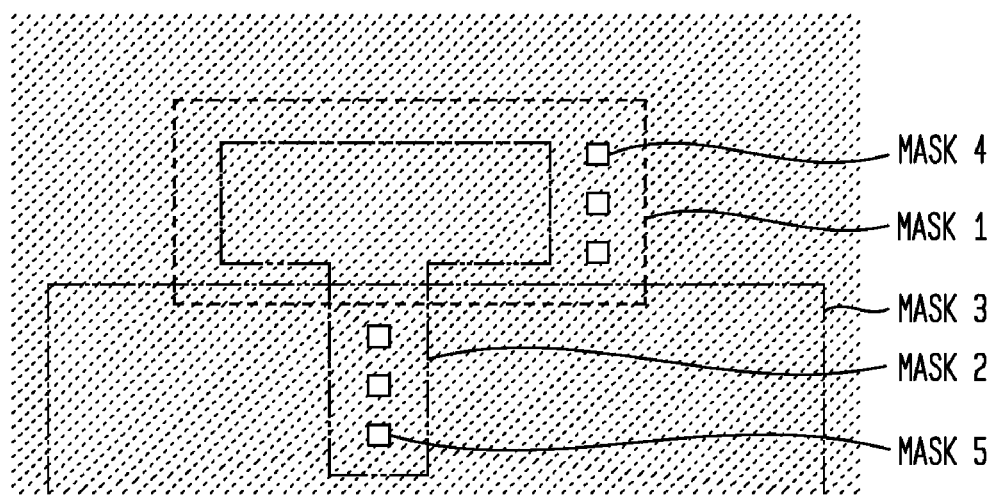
Figure 15:
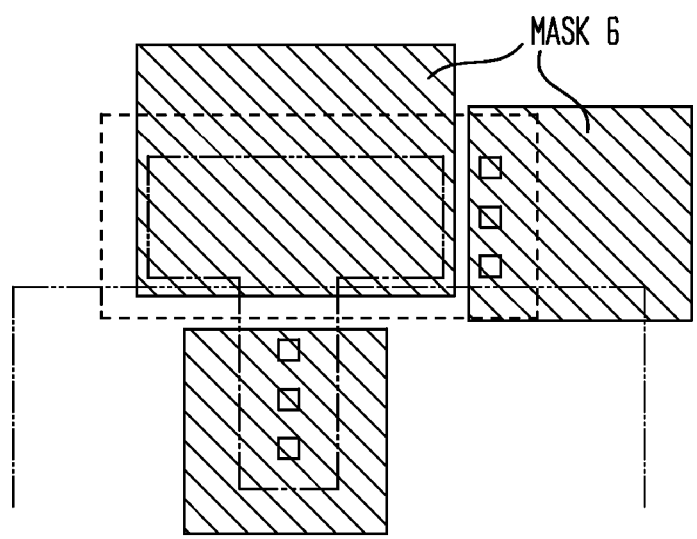
Figure 16:
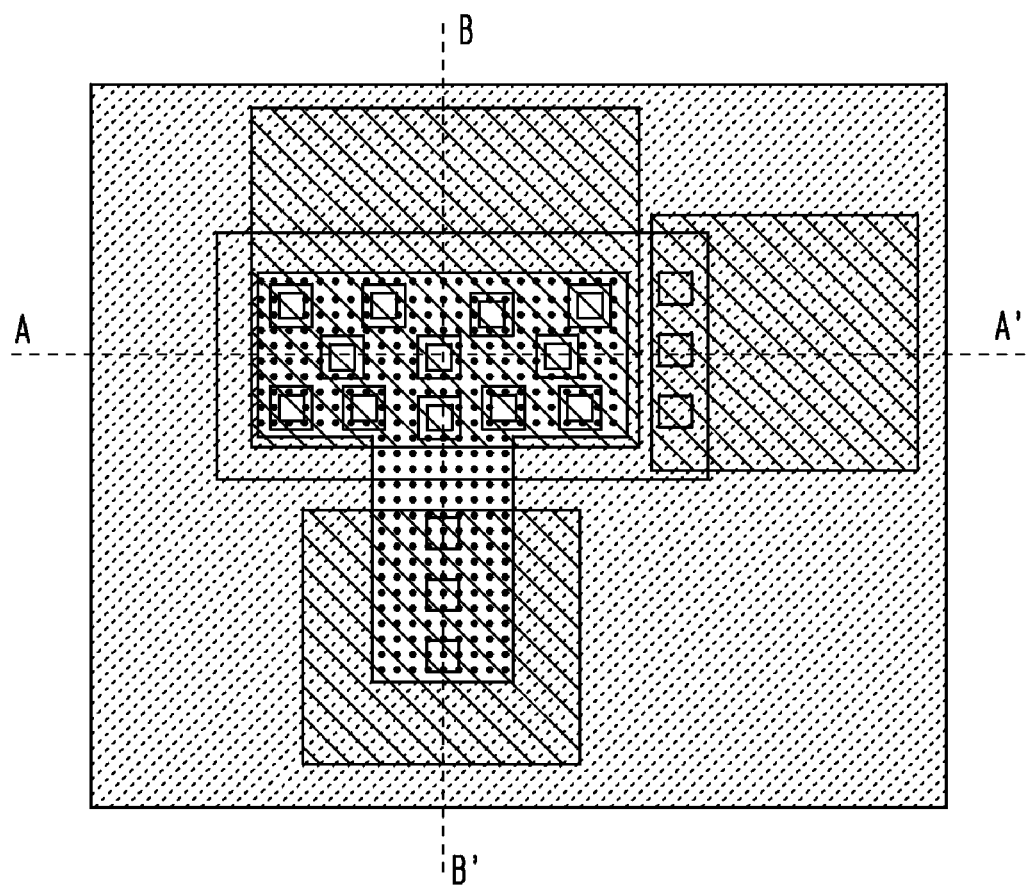
Figure 17:
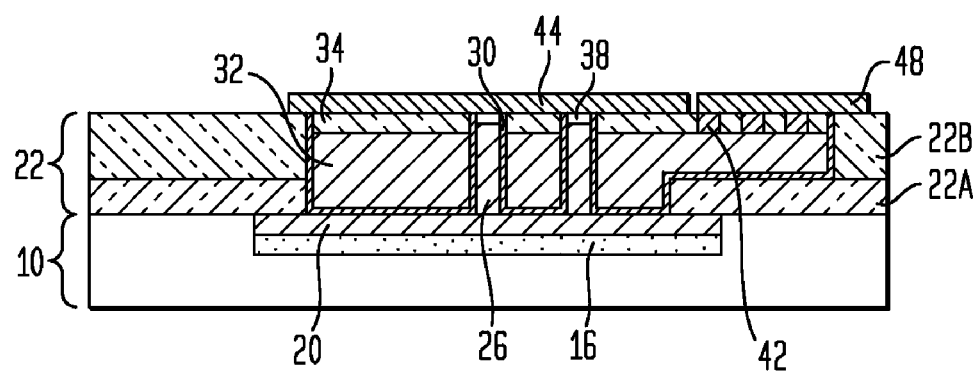
Figure 18:
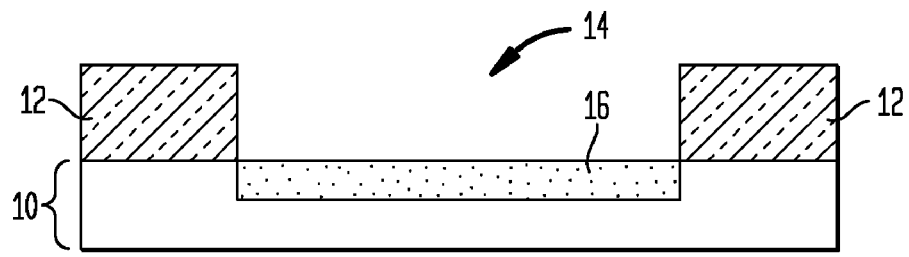
FIGS. 18-31 are pictorial representations (through cross sectional views) of a second embodiment illustrating the basic processing steps used in the present invention for fabricating a vertical FET with nanowire channels.
Figure 19:
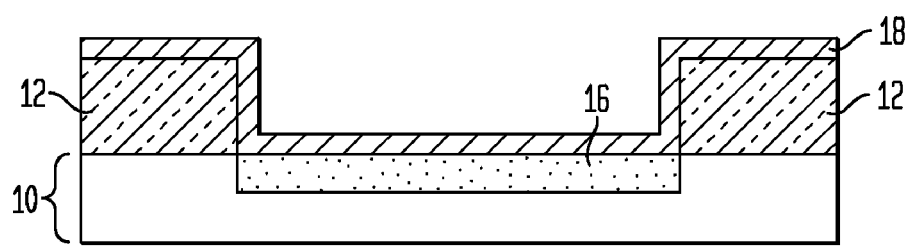
Figure 20:
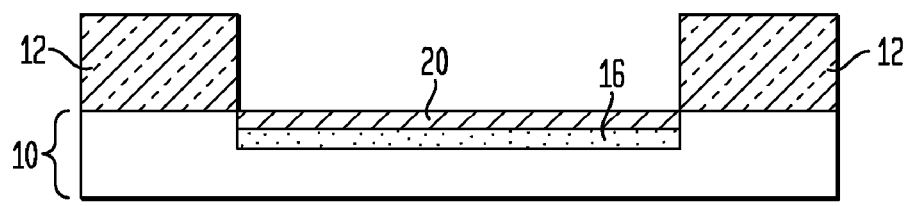
Figure 21:
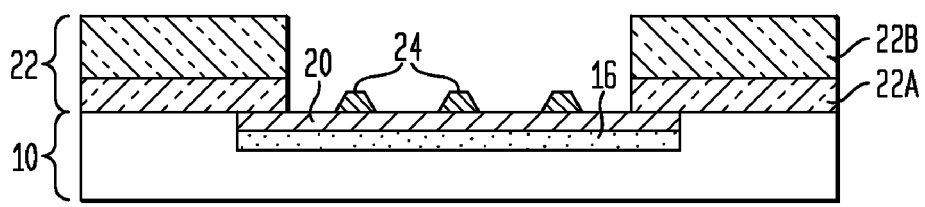

FIGS. 10 (through A-A' shown in FIG. 16, which is a top down view) and 17 (through B-B' shown in FIG. 16) show the device in the two main cross-sections after contacts were made to the source, drain and gate. To contact the source, a via hole 40 is made to the silicide surface 20. Similarly a via hole 42 is made to the gate conductor 32. The via holes for the gate and source are defined by masks 5 and 4 of FIG. 14, respectively. Finally, the drain contact 44, source contact 46 and the gate contact 48 are defined by mask 6 (FIG. 15).

FIGS. 18 to 31 show another method for the fabrication of a vertical FET with nanowire channels. The method is similar to the one discussed in FIGS. 1-17 with the following changes: (i) The catalyst is removed immediately following the growth step. (ii) There are three CMP steps: The first trims the nanowires so they all have of the same length. The second CMP step is used to remove the excess gate conductor material and the third CM? step is used to form LTO plugs over the gate conductor. (iii) The exposed top portion of the nanowire is silicided before the gate material is deposited.

The changes are introduced to allow a more robust process in view of process variations. For example, planarization of the gate conductor prior to the recess step (FIGS. 7-8) will generally results in a better control of the recess depth. The silicide formation at the top portion of the nanowire provides better selectivity during the CMP process and the etching used for recessing the gate conductor.

Figure 22:
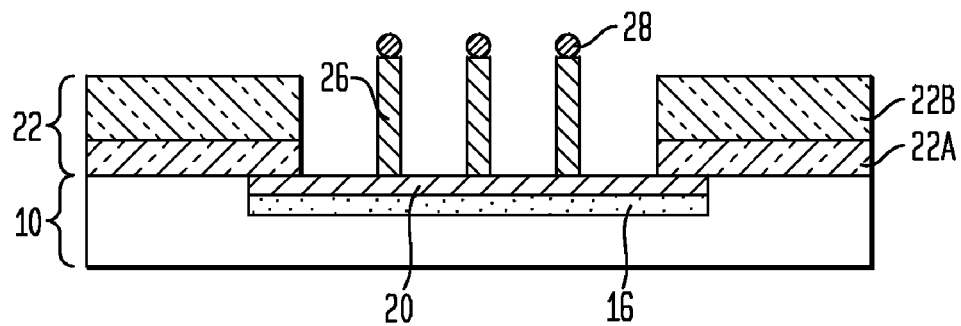
Figure 23:
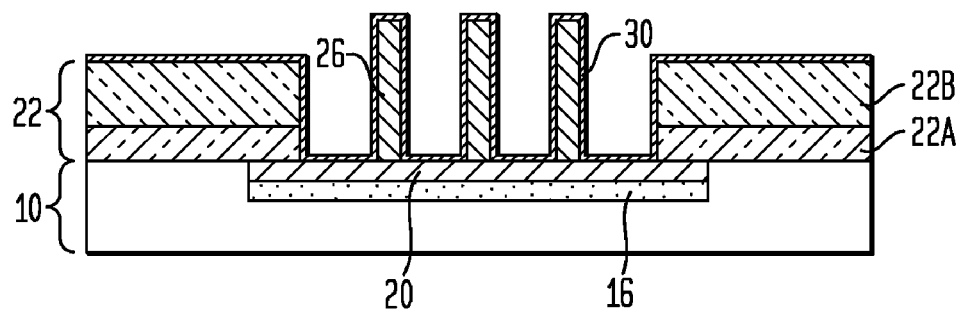
Figure 24:
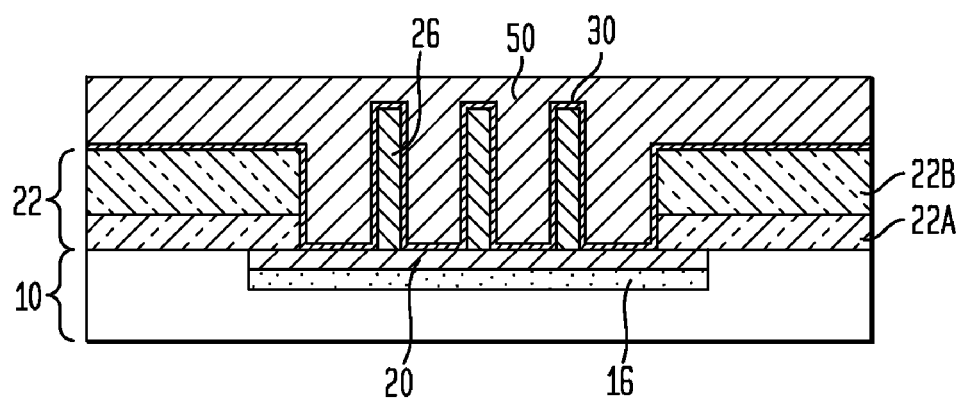
Figure 25:
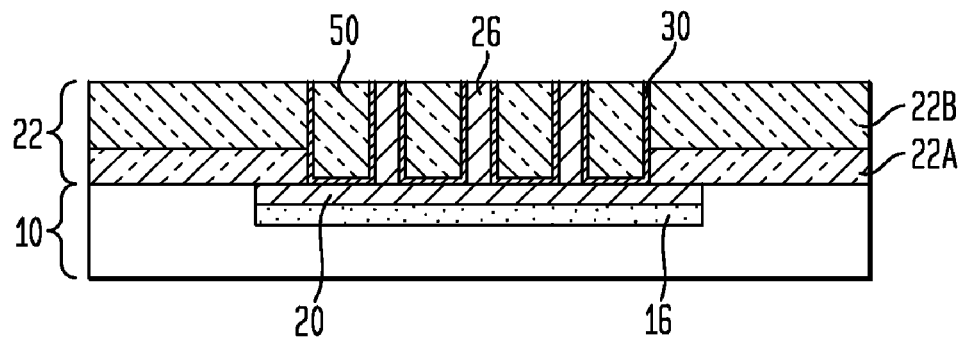

The processing steps shown in FIGS. 18-22 are identical to those discussed earlier with respect to FIGS. 1-5. Referring to FIGS. 22-23, the catalyst-silicon liquid alloy 28 is selectively removed by etching and a conformal gate dielectric 30 is deposited over the structure. A filling material 50 (organic or inorganic) such as photoresist, a polyimide or a low temperature oxide (LTO) is deposited over the structure (see, FIG. 24). The filling material 50 is chosen such that it can be selectively removed with respect to the gate dielectric 30. The wafer is planarized by CMP, with layer 22B being a hard stop for CMP. As a result all the nanowires 26 are trimmed to a single length equal to the bi-layer 22 total thickness (FIG. 25).

Figure 26:
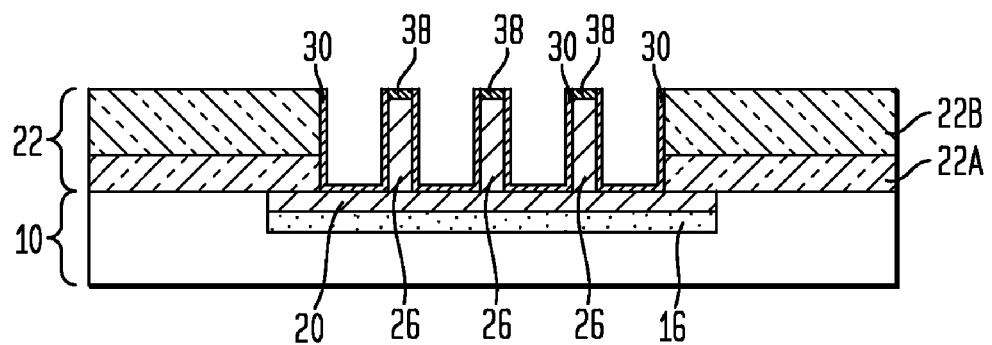

The filling material is etched out selectively and a SALICIDE step is applied to the wafer. As a result the exposed silicon surface at the tip of each nanowire is converted into silicide 38 (FIG. 26). The silicide 38 can be, for example, NiSi, $TiSi_2$ or $CoSi_2$.

Figure 27:
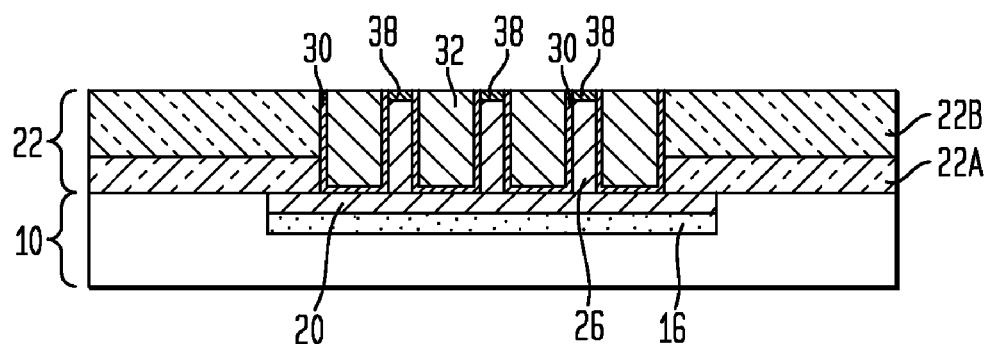
Figure 28:
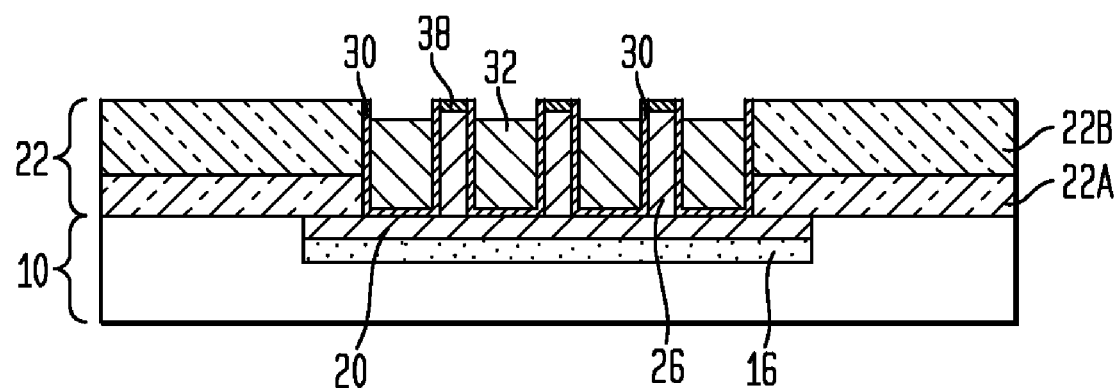
Figure 29:
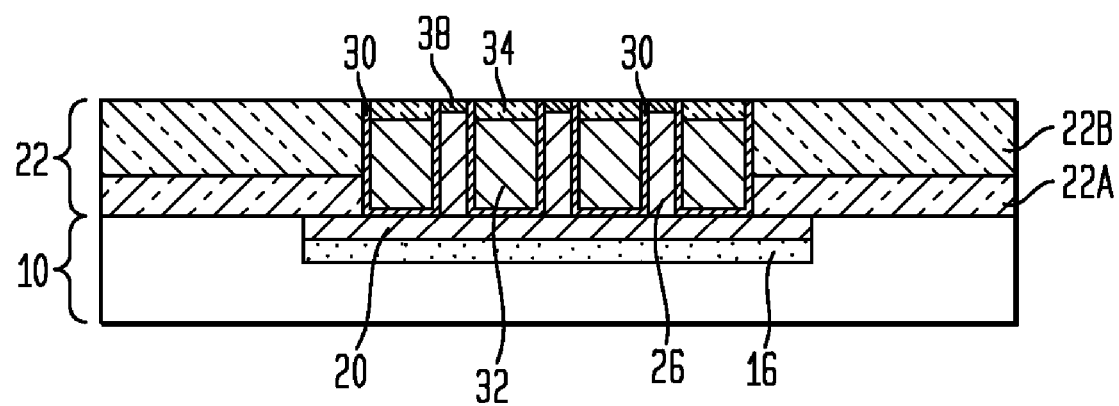

Referring to FIG. 27, a gate conductor 32 is blanket deposited and CMP is applied to remove any excess gate material above the surface of film 22. The gate material 32 is selectively recessed with respect to the silicide 38 at the top surface of the nanowires 26 (FIG. 28). An insulator 34 such as LTO is blanket deposited and CMP is applied to remove the LTO above the surface of film 22. As a result LTO plugs 34 are formed over the recessed gate conductor 32 (FIG. 29). The LTO plugs 34 isolate the contact made to the top of the nanowires from shorting to the gate.

Figure 30:
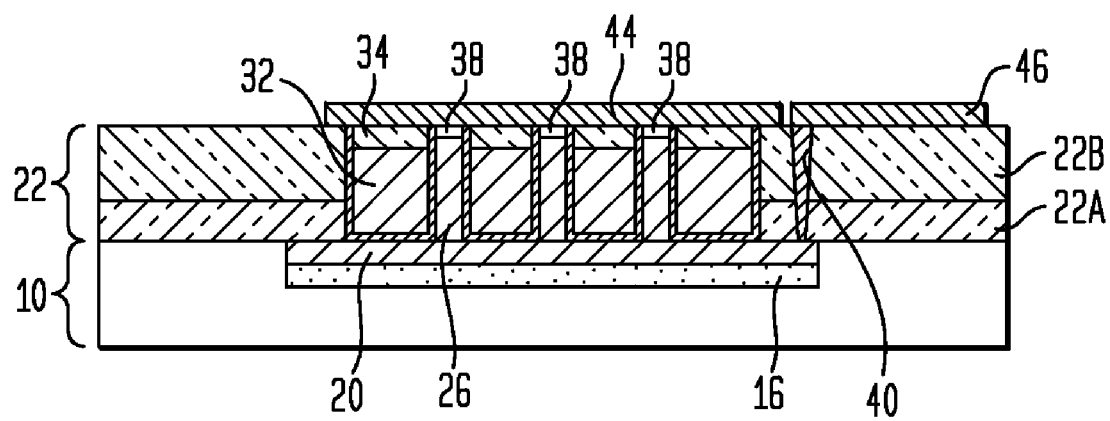
Figure 31:
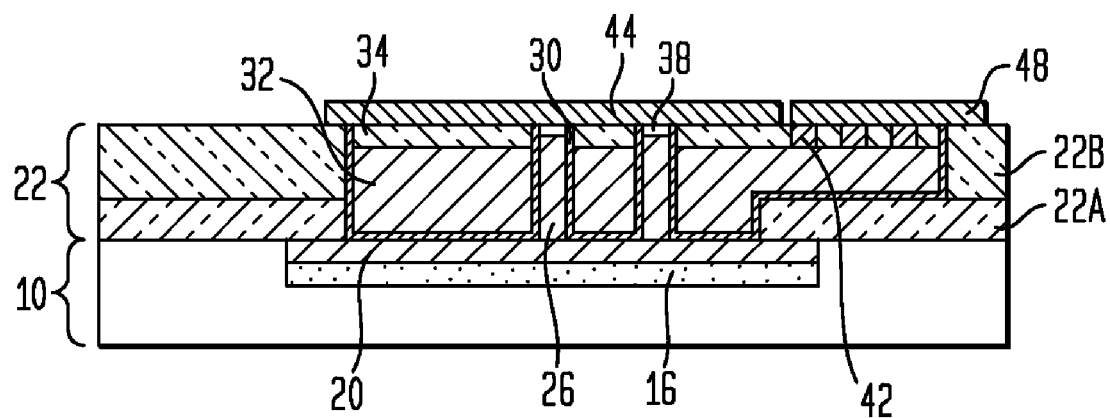

FIGS. 30 and 31 show the final structure in the two main cross sections A-A' and B-B'. To complete the fabrication, gate via 42 and source via 40 are formed and filled with a gate contact metal and the source contact metal. Finally, the drain contact 44, source contact 46 and gate contact 48 are formed. As shown, the drain contact metal 44 makes contact to the silicide 38 at the top end of the nanowires 26.

FIGS. 32 to 37 show another method for the fabrication of a vertical FET with nanowire channels that reduces the gate-source overlap capacitance. The resulting structure is similar to the one discussed in the two previous embodiments with the exception that there is an insulator plug 70 (similar to the top LTO plug 34) at the bottom end of the nanowires 26. Note that insulator plug 70 is comprised of a dielectric such as $SiO_2$. By further offsetting the bottom conductive silicide 20 layer that connects to the source from the gate conductor 32 the insulator plugs helps reducing the overlap capacitance between the gate and the source.

Figure 32:
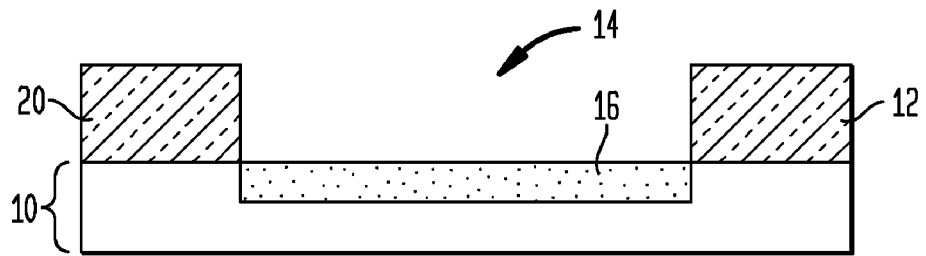
FIGS. 32-37 are pictorial representations (through cross sectional views) of a third embodiment illustrating the basic processing steps used in the present invention for fabricating a vertical FET with nanowire channels.
Figure 33:
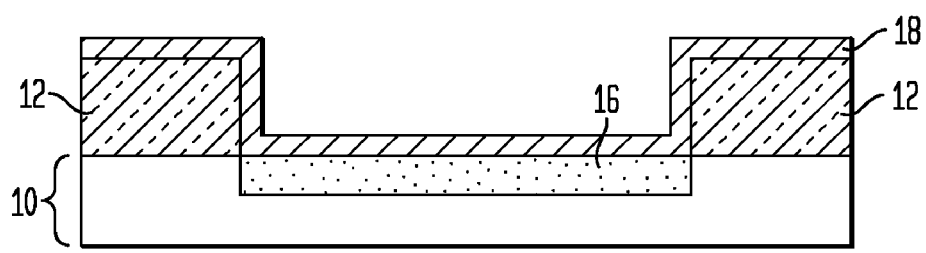
Figure 34:
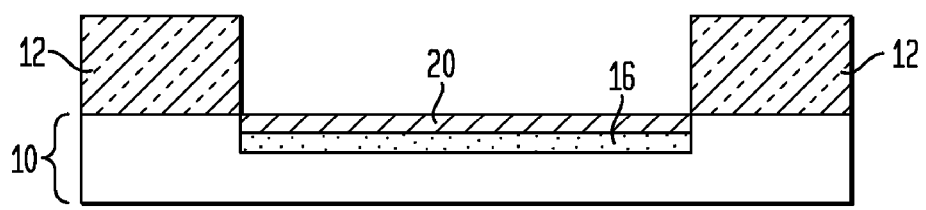
Figure 35:
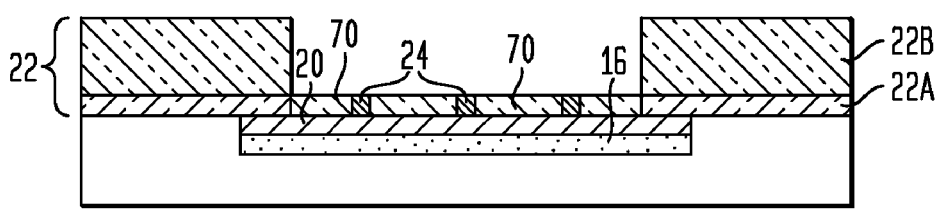

The processing steps illustrated by FIGS. 32-34 are identical to those discussed for FIGS. 1-3. Referring to FIG. 35 the catalyst 24 is surrounded by an insulating film 70 that is comprised of insulator 22A. The catalyst 24 is also in contact with the silicide layer 20. The catalyst 24 being in contact with layer 20 is required so that the nanowire orientation mimics that of the substrate 10. There are several approaches to fabricate catalysts 24 surrounded by an insulator layer 22A. In a first approach, openings having the size of the desired catalyst are made in the film 22A. This can be done by forming a self-assemble mask such as a di-block polymer over the insulator film 22A. One example of a di-block copolymer is a copolymer of polystyrene and poly(methyl methacrylate). The pores in the di-block polymer mask define the opening in the film 22A, which are etched by RIE. Gold or another like nanowire catalyst material is later introduced into the openings by plating. The catalyst 24 would not plate over the insulator film surface 22A, so catalyst 24 is only added into the openings in the film 22A.

In a second approach a catalyst film is blanket deposited over the film 22A which include openings. Since the catalyst deposition tends to washout topography the catalyst thickness in the openings is typically thicker than over the top surface of film 22A. The catalyst is then is blanket etched until all the catalyst is removed from the top surface of film 22A. Since the catalyst film is thicker in the openings, at the bottom of each opening will remain a layer of unetched catalyst.

In a third approach, the dielectric film 12 shown in FIG. 34 is removed and a blanket film 70 is deposited. Openings are made in the film 70 and a blanket catalyst film is deposited over the layer 70. The catalyst over the top surface of film 70 is "shaved" by a CMP step, but the catalyst filling the opening is not removed. Film 22B is then deposited and patterned to obtain the structure shown in FIG. 35.

In a fourth approach film 22B is deposited first and patterned using mask 2 (FIG. 12) to expose layer 20. A conformal deposition of film 70 is carried out over the structure so film 70 also covers layer 20 and the sidewalls of film 22B. Film 70 is chosen such that it has a high surface mobility for the catalyst. Openings (pores) are then formed in film 70. The size of each pore is such that it can accommodate no more than one catalyst particle. The surface of the wafer is flooded with a colloid containing the catalyst particles. Various techniques can be applied to pull the catalyst particles into the pores. In one specific technique the catalysts are negatively charged, the colloid consists of an aqueous solution, and film 70 is chosen to be $SiO_2$. The catalyst particles are naturally repelled from the negatively charged $SiO_2$ surface. To stimulate the process of populating the pores with catalyst particles, positive pulses can be applied to the substrate. Excess catalyst particles not trapped in pores can then be washed off the substrate surface using techniques well known in the art.

Figure 36:
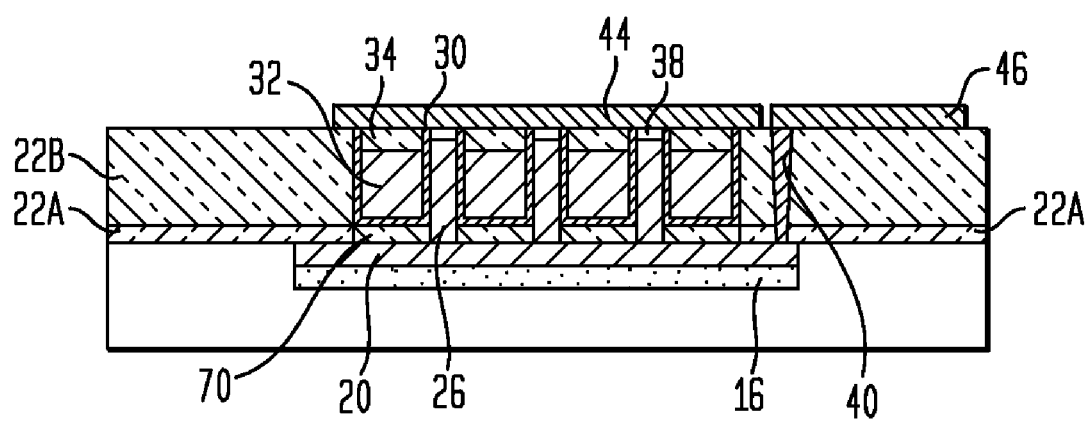
Figure 37:
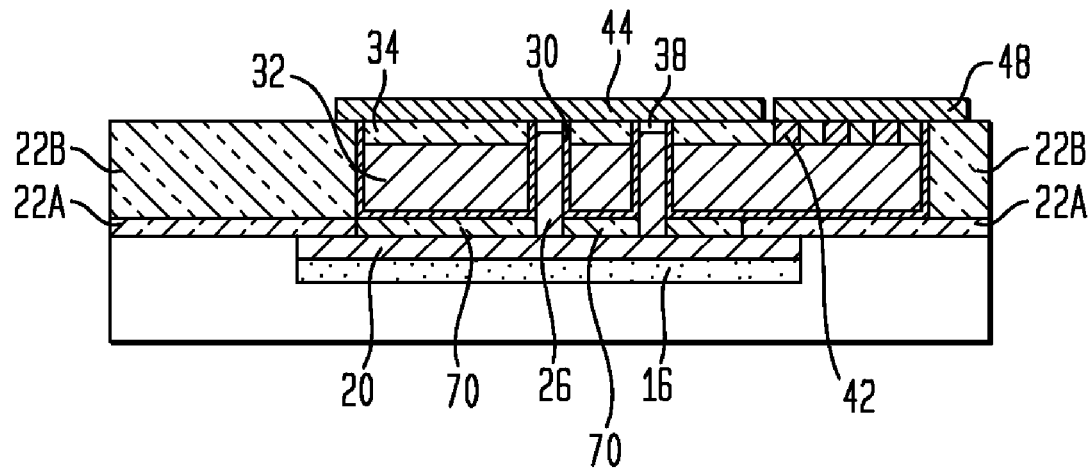

The process steps that lead to final structures shown FIGS. 36 and 37 in the two main cross-sections A-A' and B-B' remains the same as for the two embodiments discussed earlier. As a result of embedding the catalyst 24 in openings formed in layer 70, the structure is more symmetrical with dielectric plugs surrounding the top and bottom portion of the nanowires 26. These plugs 34 and 70 can be viewed as the gate spacers of a conventional planar FET that was rotated by 90 degrees.

Specifically, FIGS. 36 and 37 show a FET including a bottom epitaxial conductive layer (e.g. silicide contact 20) and a plurality of semiconductor nanowire channels 26 located on the bottom epitaxial conductive layer (e.g., silicide contact 20). In accordance with the present invention, each of the semiconductor nanowire channels 26 is perpendicular to the bottom epitaxial conductive layer. The FET also includes a top contact, i.e., drain contact 44, that is located above the plurality of semiconductor nanowire channels 26, wherein the top contact, i.e., drain contact 44, which is perpendicular to the semiconductor nanowires. The FET also includes a gate dielectric 30 surrounding each of the nanowires 26 and a gate conductor 32 surrounding the gate conductor 30. In accordance with the present invention, the gate conductor 30 is spaced apart from the bottom epitaxial conductive layer (i.e., silicide contact 20) by a bottom insulating 70 and the gate conductor 32 is spaced apart from the top contact 44 by an insulator plug 34.

The source and drain (not specifically labeled) are formed at the ends of each nanowire. Doping of the silicide can incorporate dopants (by diffusion) in the nanowires ends. Additionally, by using a doped oxide (such as borosilicate glass or phosphosilicate glass) for insulators 70 and 34, it is possible to dope the ends of the nanowires by solid source diffusion (see, for example, J. M. Hergenrother, et al. ibid.). As with the Hergenrother, et al. paper, this will require to sandwich insulator 70 and plugs 34 between two thin silicon nitride layers to prevent diffusion of the dopant into the gate material. The top end of the nanowires can also be doped separately from a gas phase before a silicide is formed (e.g., at the time of FIG. 9). Additionally, the source and drain may be intentionally made asymmetric (for example lower doping of the drain as compared with the source). This may lead to a faster device due to reduced gate-drain capacitance.

It is noted that due to the very small diameter of nanowires conventional doping techniques that are practiced in silicon technology may not be the best way to form a source and drain in the nanowires. Inducing carries in the semiconductor by appropriate surface treatment can also provide carrier rich regions at the end of the Si nanowires (as similar to what would have been achieved by doping).

Figure 38:
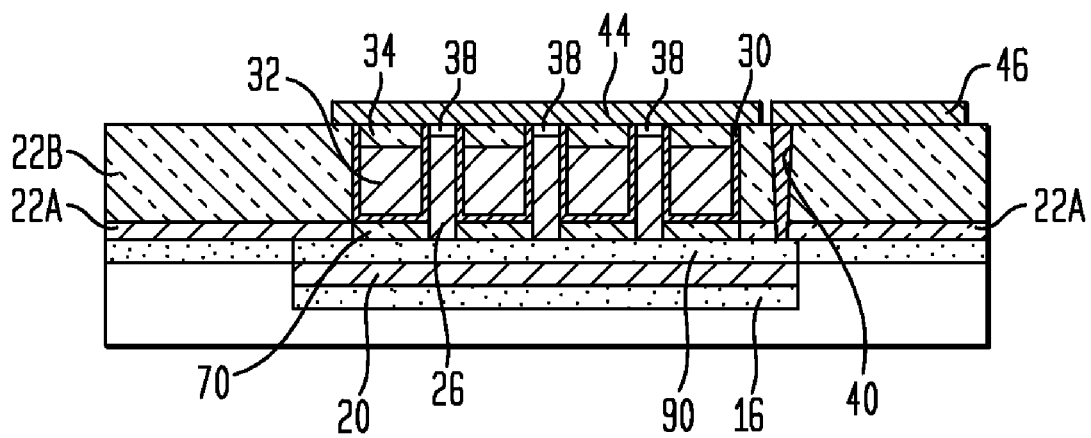
FIGS. 38 and 39 are pictorial representations (through cross sectional views) illustrating another embodiment of the present invention in which nanowires are grown on a heavily-doped epitaxial semiconductor layer.
Figure 39:
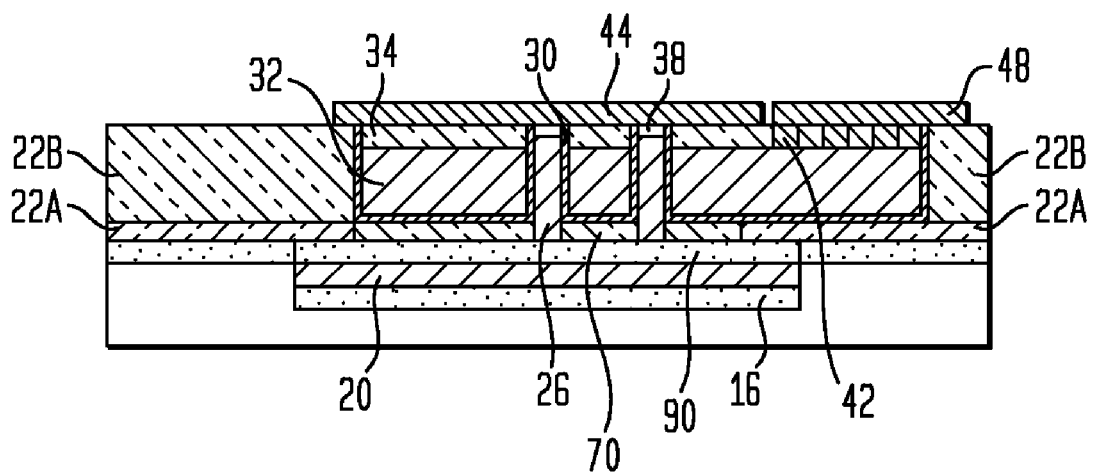

FIGS. 38 and 39 show another embodiment of present invention where the nanowires 26 are grown on a heavily-doped epitaxial semiconductor layer 90. Layer 90 is deposited over the epitaxial silicide layer 20 using techniques well known in the art. An example of silicon epitaxy on nickel silicide can be found in S. C. Wu et. al., "Epitaxy of silicon on nickel silicide", Phys. Rev. B 32, p. 6956 (1985). It is also possible to epitaxially grow silicide film 20 (e.g. $NiSi_2$) over region 16, rather than forming it by reacting a metal, as was earlier discussed in reference to the SALICIDE method. The epitaxy of the silicide film 20 can be continued by the epitaxy of the heavily-doped silicon semiconductor film 90. Forming films 20 and 90 with one-step epitaxy leads to a clean interface between the two films. The process steps that lead to the final structure of FIGS. 38 and 39 remain the same as the catalyst 24 is deposited over film 90 (FIG. 4 or 21) or in pore made in film 70 that is deposited over film 90.

In view of all the issues mentioned earlier with respect to doping of ultra-thin nanowires, another advantage for introducing layer 90 is that it can provide a source region that is external to the nanowire body. This way doping the ends of the nanowire is no longer required. An external drain region can also be added by introducing a heavily-doped semiconductor layer between the top portion of the nanowires 26 and the drain contact 44.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

forming a silicide contact layer on, or within, a specified region of a semiconductor substrate;

forming an insulating layer over said silicide contact layer;

etching openings in said insulating layer;

forming a plurality of catalyst dots comprised of one of Au, Ga, Al, Ti and Ni in said opening on said silicide contact layer, said plurality of catalysts dots are formed by a self-assembly method or epitaxy;

forming nanowires from said plurality of catalyst dots, said nanowires are oriented perpendicular to a surface of said semiconductor substrate;

siliciding a tip of each of said nanowires utilizing a self-aligned silicidation process;

depositing a gate dielectric and a gate conductor over said nanowires;

planarizing said nanowires to trim said nanowires to be of same length;

recessing the gate conductor and forming insulator plugs over said recessed gate conductor; and forming contacts to an upper surface of each of said nanowires, to said silicide contact layer and to said gate conductor.

* * * * *